US009413565B1

(12) United States Patent
Jung (10) Patent No.: US 9,413,565 B1
(45) Date of Patent: Aug. 9, 2016

(54) TERMINATION CIRCUIT, AND INTERFACE CIRCUIT AND SYSTEM INCLUDING THE SAME (71) Applicant: SK hynix Inc., Icheon-si Gyeonggi-do (KR)

(72) Inventor: Hae Kang Jung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/803,620

(22) Filed: Jul. 20, 2015

(30) Foreign Application Priority Data

Feb. 27, 2015 (KR) .................. 10-2015-0028319

(51) Int. Cl.
*H04L 25/02* (2006.01)
*H03K 19/00* (2006.01)

(52) U.S. Cl.
CPC ........ *H04L 25/0278* (2013.01); *H03K 19/0005* (2013.01); *H04L 25/028* (2013.01); *H04L 25/0292* (2013.01)

(58) Field of Classification Search
CPC ............ H04L 25/0298; H04L 25/0278; H04L 25/0292; H04L 25/028; H03K 19/0005; H03K 1/0246; H03K 1/025; G06F 13/4072
See application file for complete search history.

(56) References Cited

U.S. PATENT DOCUMENTS

| 6,108,731 | A * | 8/2000 | Suzuki | G06F 1/184 710/104 |
| 6,781,405 | B2 * | 8/2004 | Rajan | H04L 25/0278 326/30 |
| 7,205,787 | B1 * | 4/2007 | Massoumi | H04L 25/0298 326/27 |
| 7,528,626 | B2 * | 5/2009 | Kim | H03K 19/0005 326/30 |
| 7,800,399 | B1 * | 9/2010 | Schumann | H03K 19/005 326/27 |
| 7,898,878 | B2 * | 3/2011 | Nguyen | G11C 7/1018 365/189.07 |
| 7,995,660 | B2 * | 8/2011 | Cox | H04L 25/0294 375/257 |
| 8,553,471 | B2 * | 10/2013 | Kim | G11C 7/1057 365/189.05 |
| 9,105,317 | B2 * | 8/2015 | Eom | H03K 19/0005 |
| 9,111,603 | B1 * | 8/2015 | Wang | G11C 5/147 |
| 2006/0119380 | A1 * | 6/2006 | Gonzalez | H04L 25/0278 326/30 |
| 2007/0126464 | A1 * | 6/2007 | Vergis | G11C 5/063 326/30 |
| 2010/0321059 | A1 * | 12/2010 | Nakatsu | H03K 19/017509 326/30 |
| 2014/0140146 | A1 * | 5/2014 | Mozak | G05F 1/10 365/189.07 |

FOREIGN PATENT DOCUMENTS

KR 100688539 B1 2/2007
KR 1020140055120 A 5/2014

* cited by examiner

Primary Examiner — Sophia Vlahos
(74) Attorney, Agent, or Firm — William Park & Associates Ltd.

(57) ABSTRACT

An interface circuit may include a termination resistor and a termination voltage generation unit. The termination resistor may be coupled between a reception pad and a termination node. The termination voltage generation unit may detect a voltage level of the termination node, and may drive the termination node to a level of a termination voltage when the voltage level of the termination node deviates from a predetermined range.

17 Claims, 5 Drawing Sheets

TERMINATION CIRCUIT, AND INTERFACE CIRCUIT AND SYSTEM INCLUDING THE SAME

CROSS-REFERENCES TO RELATED APPLICATION

The present application claims priority under 35 U.S.C. §119(a) to Korean application number 10-2015-0028319, filed on Feb. 27, 2015, in the Korean Intellectual Property Office, which is incorporated herein by reference in its entirety.

BACKGROUND

1. Technical Field

Various embodiments generally relate to a communication system. Various embodiments may generally relate to an interface circuit and/or termination circuit, and system including the communication system.

2. Related Art

Electronic products for personal uses, such as a personal computer, a tablet PC, a laptop computer and a smart phone, are constructed by various electronic components. Two different electronic components in the electronic products may communicate at a high speed to process a large amount of data within a short amount of time. The electronic components generally communicate through interface circuits.

As the performances of electronic components are improved, necessity for a communication scheme capable of increasing a bandwidth and reducing power consumption is being increased. As power consumption decreases, the swing widths of signals to be transmitted through signal transmission lines which couple electronic components is decreasing. Therefore, in order to ensure precise transmission of signals, impedance matching of electronic components for transmitting and receiving signals is important.

SUMMARY

In an embodiment, an interface circuit may be provided. The interface circuit may include a termination resistor coupled between a reception pad and a termination node. The interface circuit may include a termination voltage generation unit configured to detect a voltage level of the termination node, and drive the termination node to a level of a termination voltage when the voltage level of the termination node deviates from a predetermined range.

In an embodiment, a system may be provided. The system may include a transmission device configured to drive a signal transmission line and transmit a signal. The system may include a reception device coupled with the signal transmission line, and may be configured to receive the signal. The reception device may include a termination resistor coupled between the signal transmission line and a termination node. The reception device may include a termination voltage generation unit configured to detect a voltage level of the termination node, and drive the termination node to a level of a termination voltage when the voltage level of the termination node deviates from a predetermined range.

In an embodiment, a termination circuit may be provided. The termination circuit may include a termination resistor. The termination circuit may include a termination voltage generation unit coupled to the termination resistor through a termination node. The termination voltage generation unit may be configured to detect a voltage level of the termination node, and may drive the termination node to a level of a termination voltage when the voltage level of the termination node deviates from a predetermined range.

DETAILED DESCRIPTION

Hereinafter, a termination circuit, and an interface circuit and system including the same will be described below with reference to the accompanying drawings through various examples of embodiments.

Figure 1:
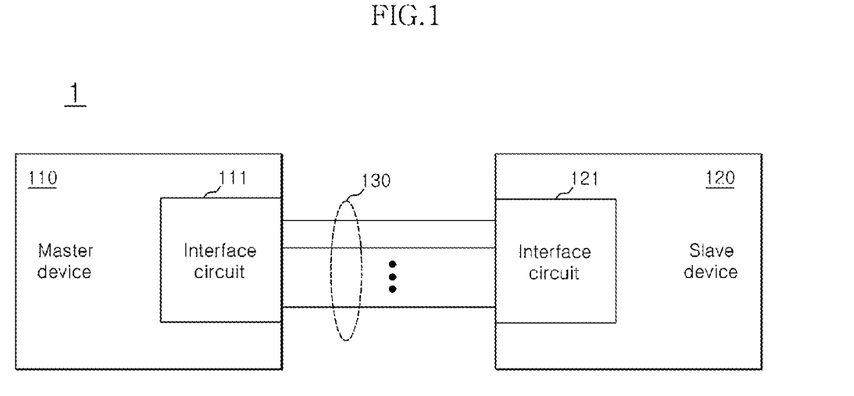
FIG. 1 is a diagram illustrating a representation of an example of a configuration of a system in accordance with an embodiment.

In FIG. 1, a system 1 in accordance with an embodiment may include a master device 110 and a slave device 120. The system 1 may mean, for example, a group of internal components constructing electronic devices such as, for example but not limited to, workstations, laptops, client-side terminals, servers, distributed computing systems, hand-held devices and video game consoles. The master device 110 and the slave device 120 may form one link.

The master device 110 may control the operation of the slave device 120. The master device 110 may execute an operation system and perform various calculation functions in an electronic device. For example, the master device 110 may include a processor, and the processor may include, for example but not limited to, a central processing unit (CPU), a graphic processing unit (GPU), a multimedia processor (MMP) or a digital signal processor (DSP). The master device 110 may be realized in the form of a system-on-chip (SoC) by combining processor chips having various functions, such as application processors.

The slave device 120 may perform various operations by being controlled by the master device 110. The slave device 120 may include components. All of the components included in the slave device 120 operate by being controlled by the master device 110. For example, the slave device 120 may include, for example but not limited to, a system memory, a power controller, or a module such as a communication module, a multimedia module and an input/output module capable of performing various functions. For instance, the slave device 120 may be a memory device. The memory device may include a volatile memory device such as, for example but not limited to, an SRAM (static RAM), a DRAM (dynamic RAM) and an SDRAM (synchronous DRAM). The memory device may include at least one of nonvolatile memory devices such as, for example but not limited to, a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM) and an FRAM (ferroelectric RAM).

The master device 110 may be coupled with the slave device 120 through a plurality of buses 130, and thereby form a link. The master device 110 may transmit signals to the slave device 120, through the plurality of buses 130. The master device 110 may receive the signals transmitted from the slave device 120, through the plurality of buses 130. For example, the plurality of buses 130 may include, but not limited to, signal transmission lines such as data buses, command buses, address buses and clock buses.

The master device 110 and the slave device 120 may include interface circuits 111 and 121, respectively, to reliably perform communication. The interface circuit 111 of the master device 110 may transmit signals to the slave device 120 and receive the signals transmitted from the slave device 120, through the buses 130. For example, the interface circuit 111 may convert the signals used in the master device 110 into signals appropriate to be transmitted through the buses 130 or convert the signals transmitted through the buses 130 into signals appropriate to be used in the master device 110. The interface circuit 121 of the slave device 120 may receive the signals transmitted from the master device 110 and transmit signals to the master device 110, through the buses 130. For example, the interface circuit 121 may convert the signals transmitted through the buses 130 into signals appropriate to be used in the slave device 120 or convert the signals used in the slave device 120 into signals appropriate to be transmitted through the buses 130. For example, the master device 110 and the slave device 120 may be the components of a system using a serial communication scheme, and the interface circuits 111 and 121 may include, for example, components such as, but not limited to, encoding units, decoding units, serialization units and parallelization units.

Since the master device 110 and the slave device 120 are different components constructing one system, impedance matching of both devices may be needed for reliable communication between the master device 110 and the slave device 120. As the operation speed of a system increases and the power consumption of the system decreases, the swing widths or amplitudes of signals to be transmitted through the buses 130 are gradually decreasing. Therefore, it may be necessary that the impedance of the interface circuit coupled with one ends of the buses 130 correspond to the impedance of the interface circuit coupled with the other ends of the buses 130. The interface circuits 111 and 121 may include termination circuits for such impedance matching. Each termination circuit may be a circuit to control the impedance of a device for receiving the signals transmitted through the buses 130, such that the reception device may have substantially the same impedance as the impedance of a device for transmitting the signals.

Figure 2:
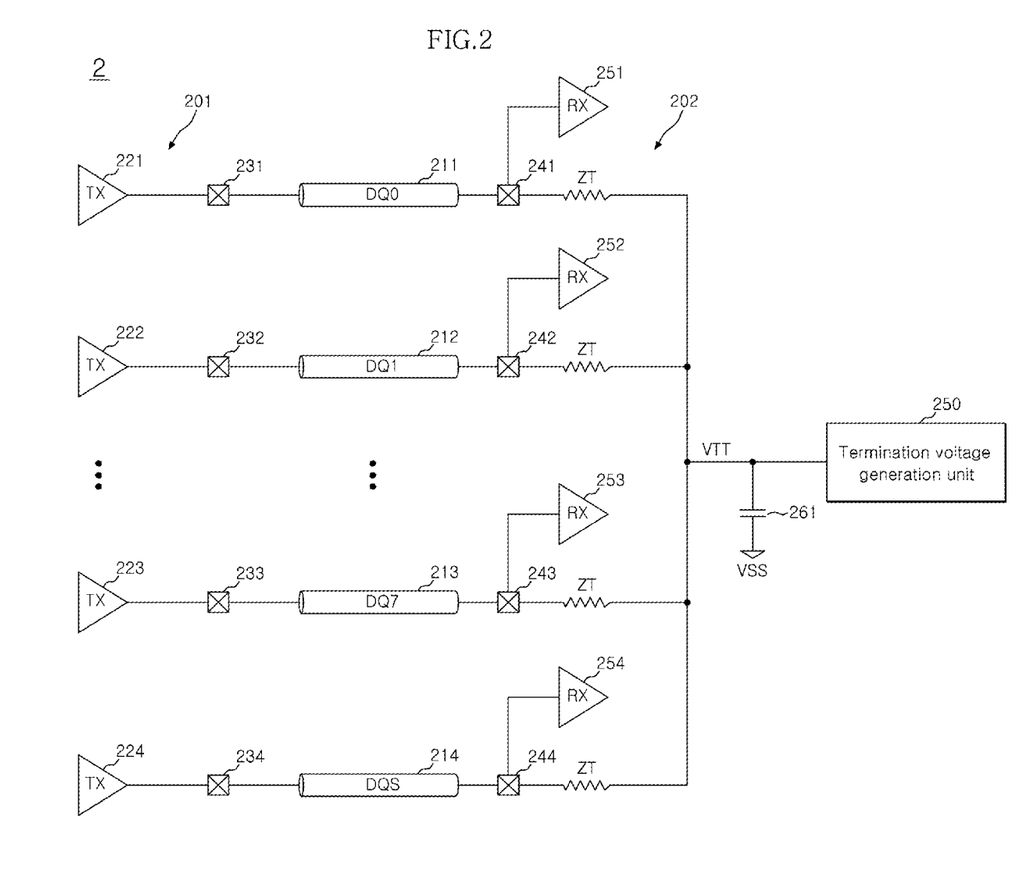
FIG. 2 is a diagram illustrating a representation of an example of a configuration of a system in accordance with an embodiment.

FIG. 2 is a diagram illustrating a representation of an example of a configuration of a system 2 in accordance with an embodiment. The components illustrated on the left side of signal transmission lines 211 to 214 may be the components of the interface circuit 111 of the master device 110 (i.e., see FIG. 1). The components illustrated on the right side of the signal transmission lines 211 to 214 may be the components of the interface circuit 121 of the slave device 120 (i.e., see FIG. 1). When the master device 110 transmits signals to the slave device 120, an interface circuit 201 may be the component of the interface circuit 111 of the master device 110, and an interface circuit 202 may be the component of the interface circuit 121 of the slave device 120. Conversely, when the slave device 120 transmits signals to the master device 110, the interface circuit 201 may be the component of the interface circuit 121 of the slave device 120, and the interface circuit 202 may be the component of the interface circuit 111 of the master device 110.

The interface circuit 201 may include a plurality of signal transmission units TX. The plurality of signal transmission units TX may include a plurality of data transmission units 221 to 223 and a data strobe transmission unit 224. The plurality of data transmission units 221 to 223 may be respectively coupled with a plurality of data transmission lines 211 to 213 through data transmission pads 231 to 233. The plurality of data transmission units 221 to 223 may drive the data transmission lines 211 to 213 according to the level of data to transmit. For example, in the case where the level of data to transmit is a logic high, the data transmission units 221 to 223 may drive the data transmission lines 211 to 213 to a high level. For example, in the case where the level of data to transmit is a logic low, the data transmission units 221 to 223 may drive the data transmission lines 211 to 213 to a low level. If the data transmission lines 211 to 213 are driven by the data transmission units 221 to 223, first to eighth data DQ0 to DQ7 may be transmitted through the data transmission lines 211 to 213. The data strobe transmission unit 224 may be coupled with a data strobe signal transmission line 214 through a data strobe transmission pad 234. The data strobe transmission unit 224 may transmit a data strobe signal DQS through the data strobe signal transmission line 214. The data strobe signal DQS, as a signal capable of being synchronized with timing at which the data DQ0 to DQ7 are transmitted, is a signal capable of notifying timing at which the data DQ0 to DQ7 are transmitted, from the interface circuit 201 of the master device to the interface circuit 202 of the slave device.

The interface circuit 202 may include a plurality of reception pads 241 to 244. The reception pads 241 to 244 are respectively coupled with the signal transmission lines 211 to 214. The respective data transmission lines 211 to 213 may be coupled with termination resistors ZT through the data reception pads 241 to 243. The termination resistors ZT may be coupled between the data transmission lines 211 to 213 and a termination node VTT. The interface circuit 202 may include a plurality of signal reception units RX. The plurality of signal reception units RX may include a plurality of data reception units 251 to 253 and a data strobe reception unit 254. The plurality of data reception units 251 to 253 may be coupled with the data transmission lines 211 to 213 through the data reception pads 241 to 243 to receive the data DQ0 to DQ7 transmitted through the data transmission lines 211 to 213.

The termination resistors ZT may be provided for impedance matching between the interface circuit 201 and the interface circuit 202. The termination resistors ZT may have substantially the same impedance values as the turn-on impedance values of the data transmission units 221 to 223, respectively. The termination node VTT may be set to a termination voltage level. The impedance matching may be completed when the data reception pads 241 to 243 are coupled with the termination resistors ZT and the termination node VTT is set to the termination voltage level.

The interface circuit 202 may include a termination voltage generation unit 250 configured to set the termination node VTT to the termination voltage level. The termination voltage generation unit 250 may be coupled with the termination node VTT, and may detect the voltage level of the termination node VTT. The termination voltage generation unit 250 may drive the termination node VTT to the level of a termination voltage when the voltage level of the termination node VTT deviates from a predetermined range. The termination voltage generation unit 250 may float the termination node VTT when the voltage level of the termination node VTT is within the predetermined range. The termination voltage may have a certain voltage level between a power supply voltage and a ground voltage. For example, the termination voltage may have a level corresponding to the middle level between the power supply voltage and the ground voltage.

The interface circuit 202 may include a capacitor element 261. The capacitor element may be coupled with the termination node VTT. The capacitor element 261 may stabilize the voltage level of the termination node VTT. The capacitor element 261 may prevent the voltage level of the termination node VTT from fluctuating due to a voltage variation, a temperature variation or other noise.

The interface circuit 202 may include a data strobe reception pad 244. The data strobe reception pad 244 may be coupled with the data strobe signal transmission line 214. The data strobe signal transmission line 214 may be coupled with a termination resistor ZT through the data strobe reception pad 244. The termination resistor ZT may be coupled with the termination node VTT. The data strobe signal transmission line 214 may be coupled with the data strobe reception unit 254 through the data strobe reception pad 244. The data strobe reception unit 254 may receive the data strobe signal DQS transmitted through the data strobe signal transmission line 214.

Figure 3:
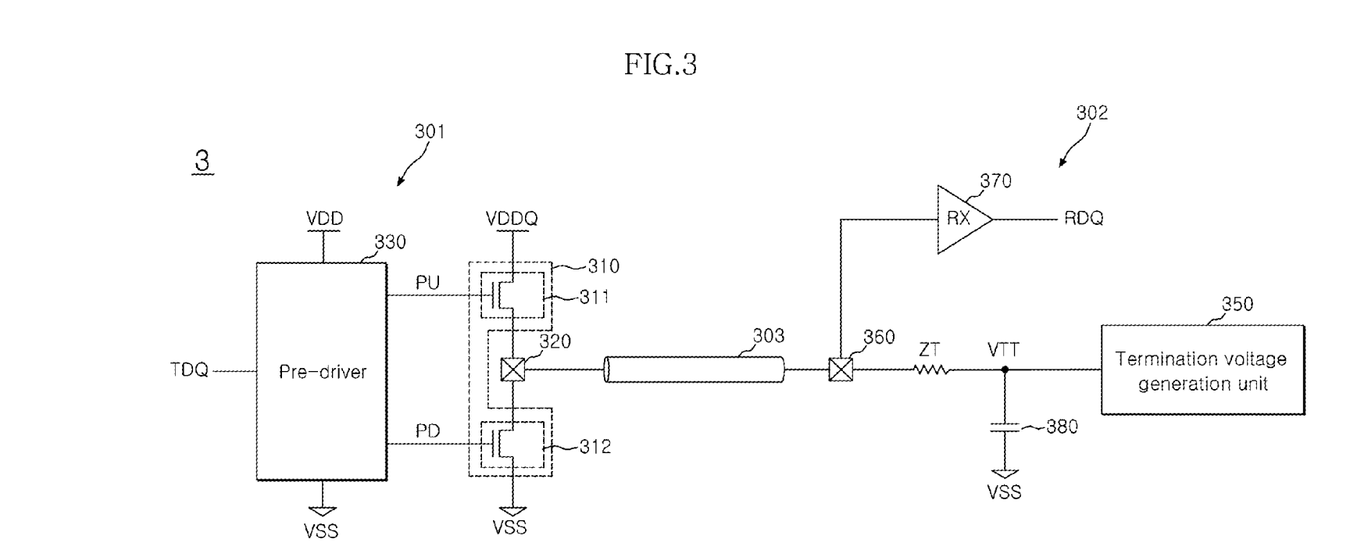
FIG. 3 is a diagram illustrating a representation of an example of a configuration of a system in accordance with an embodiment.

FIG. 3 is a diagram illustrating a representation of an example of a configuration of a system 3 in accordance with an embodiment. Referring to FIG. 3, the system 3 may include a transmission device and a reception device. The transmission device may include a transmission interface circuit 301, and the reception device may include a reception interface circuit 302. The transmission interface circuit 301 may be coupled with the reception interface circuit 302 through a signal transmission line 303. Referring to FIG. 3, the transmission interface circuit 301 may include a transmission driver 310. The transmission driver 310 may be any one of the data transmission units 221 to 223 and the data strobe transmission unit 224 illustrated in FIG. 2. The transmission driver 310 may drive the signal transmission line 303 based on a transmission signal TDQ. For example, the transmission driver 310 may drive the signal transmission line 303 to a high level when the transmission signal TDQ is a high level, and may drive the signal transmission line 303 to a low level when the transmission signal TDQ is a low level. The transmission driver 310 may be coupled with the signal transmission line 303 through a transmission pad 320.

The transmission driver 310 may include a pull-up transmission driver 311 and a pull-down transmission driver 312. The pull-up transmission driver 311 may be coupled between the terminal of a first power supply voltage VDDQ and the transmission pad 320. The pull-up transmission driver 311 may be turned on in response to a pull-up transmission control signal PU. The pull-up transmission driver 311 may pull-up drive the transmission pad 320 and the signal transmission line 303 coupled with the transmission pad 320, to the level of the first power supply voltage VDDQ. The pull-down transmission driver 312 may be coupled between the terminal of a ground voltage VSS and the transmission pad 320. The pull-down transmission driver 312 may be turned on in response to a pull-down transmission control signal PD. The pull-down transmission driver 312 may pull-down drive the transmission pad 320 and the signal transmission line 303 coupled with the transmission pad 320, to the level of the ground voltage VSS. Each of the pull-up transmission driver 311 and the pull-down transmission driver 312 may include an N channel MOS transistor.

The transmission interface circuit 301 may include a pre-driver 330. The pre-driver 330 may generate the transmission control signals PU and PD based on the transmission signal TDQ. For example, the pre-driver 330 may drive the pull-up transmission control signal PU to the level of a second power supply voltage VDD when the transmission signal TDQ with a high level is received. For example, the pre-driver 330 may drive the pull-down transmission control signal PD to the level of the second power supply voltage VDD when the transmission signal TDQ with a low level is received. The first power supply voltage VDDQ and the second power supply voltage VDD may be voltages having substantially the same levels, but may be voltages which are generated from different power sources.

The reception interface circuit 302 may include a termination resistor ZT and a termination voltage generation unit 350. The termination resistor ZT and the termination voltage generation unit 350 may construct the termination circuit of the reception interface circuit 302. The termination resistor ZT may be coupled between a reception pad 360 and a termination node VTT. The reception pad 360 may be coupled with the signal transmission line 303. The impedance value of the termination resistor ZT may correspond to the turn-on impedance value of the pull-up transmission driver 311 and the pull-down transmission driver 312. The pull-up transmission driver 311 and the pull-down transmission driver 312 construct the transmission driver 310. The turn-on impedance value may be an impedance value that the pull-up transmission driver 311 and the pull-down transmission driver 312 have when they are turned on. When a signal is transmitted through the signal transmission line 303, one of either the pull-up transmission driver 311 or the pull-down transmission driver 312 is turned on and drives the signal transmission line 303. Thus, the impedance value of the termination resistor ZT may be substantially the same as the turn-on impedance value of the pull-up transmission driver 311 and the pull-down transmission driver 312.

The termination voltage generation unit 350 may be coupled with the termination node VTT, and may detect the voltage level of the termination node VTT. The termination voltage generation unit 350 may drive the termination node VTT to the level of the termination voltage when the voltage level of the termination node VTT deviates from a predetermined range. The termination voltage generation unit 350 may float the termination node VTT when the voltage level of the termination node VTT is within the predetermined range. The termination voltage may have a level corresponding to the middle level between the first power supply voltage VDDQ and the ground voltage VSS.

The reception interface circuit 302 may include a receiver 370. The receiver 370 may be coupled with the reception pad 360. The receiver 370 may amplify the signal transmitted through the signal transmission line 303, and generate a reception signal RDQ. Since the reception pad 360 is coupled with the termination resistor ZT, the receiver 370 may precisely receive the signal transmitted through the signal transmission line 303 from the transmission interface circuit 301. The reception interface circuit 302 may include a capacitor element 380. The capacitor element 380 may be coupled between the termination node VTT and the ground voltage VSS. The capacitor element 380 may stabilize the voltage level of the termination node VTT. For example, the capacitor element 380 may prevent the voltage level of the termination node VTT from fluctuating due to a voltage variation, a temperature variation or other noise.

Figure 4:
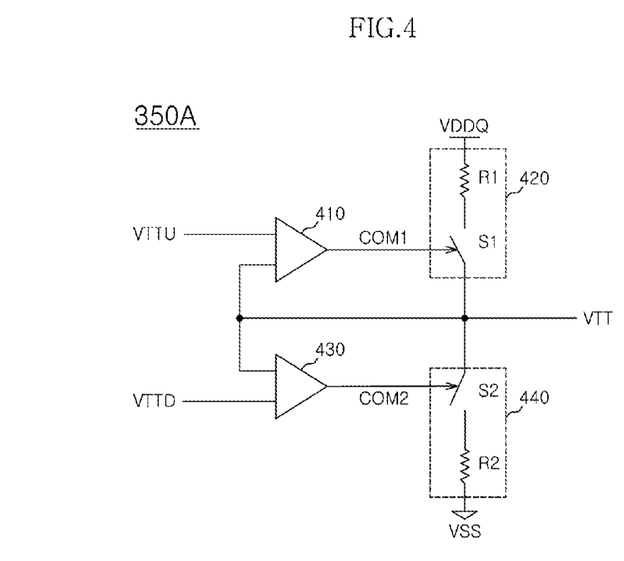
FIG. 4 is a diagram illustrating a representation of an example of a configuration of the termination voltage generation unit illustrated in FIG. 3.

FIG. 4 is a diagram illustrating a representation of an example of a configuration of the termination voltage generation unit 350 illustrated in FIG. 3. Referring to FIG. 4, a termination voltage generation unit 350A may include a first comparator 410, a pull-up driver 420, a second comparator 430, and a pull-down driver 440. The first comparator 410 may compare the voltage level of the termination node VTT and an up reference voltage VTTU, and generate a first comparison signal COM1. The up reference voltage VTTU may have a level higher than the level of the termination voltage. The up reference voltage VTTU as a voltage capable of defining the upper limit of the predetermined range may be set randomly. The pull-up driver 420 may pull-up drive the termination node VTT in response to the first comparison signal COM1. The pull-up driver 420 may be coupled between the terminal of the first power supply voltage VDDQ and the termination node VTT, and may drive the termination node VTT with the first power supply voltage VDDQ when being turned on.

The second comparator 430 may compare the voltage level of the termination node VTT and a down reference voltage VTTD, and generate a second comparison signal COM2. The down reference voltage VTTD may have a level lower than the level of the termination voltage. The down reference voltage VTTD as a voltage capable of defining the lower limit of the predetermined range may be set randomly. The pull-down driver 440 may pull-down drive the termination node VTT in response to the second comparison signal COM2. The pull-down driver 440 may be coupled between the terminal of the ground voltage VSS and the termination node VTT, and may drive the termination node VTT with the ground voltage VSS when being turned on.

Referring to FIG. 4, the pull-up driver 420 may include a first resistor element R1 and a first switching element S1. The first resistor element R1 may be coupled with the terminal of the first power supply voltage VDDQ. The first switching element S1 may be coupled between the first resistor element R1 and the termination node VTT, and be turned on in response to the first comparison signal COM1. The pull-down driver 440 may include a second resistor element R2 and a second switching element S2. The second resistor element R2 may be coupled with the terminal of the ground voltage VSS. The second switching element S2 may be coupled between the second resistor element R2 and the termination node VTT, and may be turned on in response to the second comparison signal COM2. The first and second resistor elements R1 and R2 may have the same impedance value or substantially the same impedance value, and may have an impedance value smaller than the impedance value of the termination resistor ZT.

Figure 5:
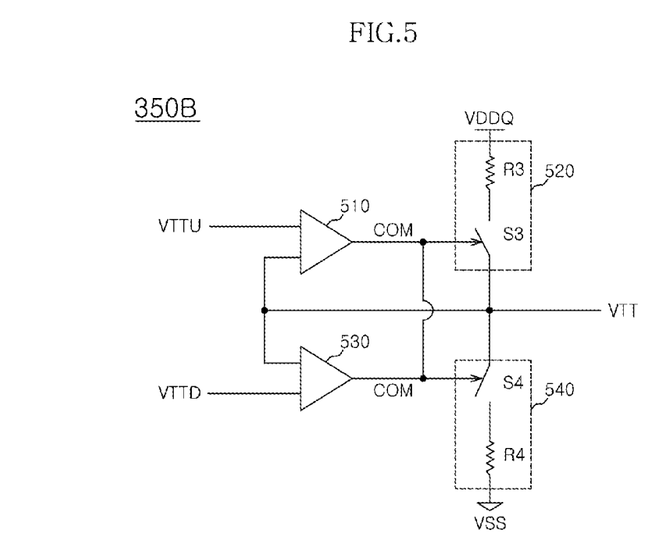
FIG. 5 is a diagram illustrating a representation of an example of a configuration of the termination voltage generation unit illustrated in FIG. 3.

FIG. 5 is a diagram illustrating a representation of an example of a configuration of the termination voltage generation unit 350 illustrated in FIG. 3. Referring to FIG. 5, a termination voltage generation unit 350B may include a first comparator 510, a pull-up driver 520, a second comparator 530, and a pull-down driver 540. The pull-up driver 520 may include a third resistor element R3 and a third switching element S3. The pull-down driver 540 may include a fourth resistor element R4 and a fourth switching element S4. The termination voltage generation unit 350B may have substantially the same configuration as the termination voltage generation unit 350A illustrated in FIG. 4 except that the output nodes of the first and second comparators 510 and 530 are coupled with each other. As the output nodes of the first and second comparators 510 and 530 are coupled, both the pull-up driver 520 and the pull-down driver 540 may be driven in the example where the voltage level of the termination node VTT deviates from the predetermined range. A comparison signal COM may be enabled in the example where the voltage level of the termination node VTT becomes higher than the up reference voltage VTTU or becomes lower than the down reference voltage VTTD. The pull-up driver 520 and the pull-down driver 540 may drive the termination node VTT with the first power supply voltage VDDQ and the ground voltage VSS, respectively, in response to the comparison signal COM. Accordingly, the termination voltage generation unit 350B may stably set the voltage level of the termination node VTT to the termination voltage level by decreasing a switching count.

Figure 6:
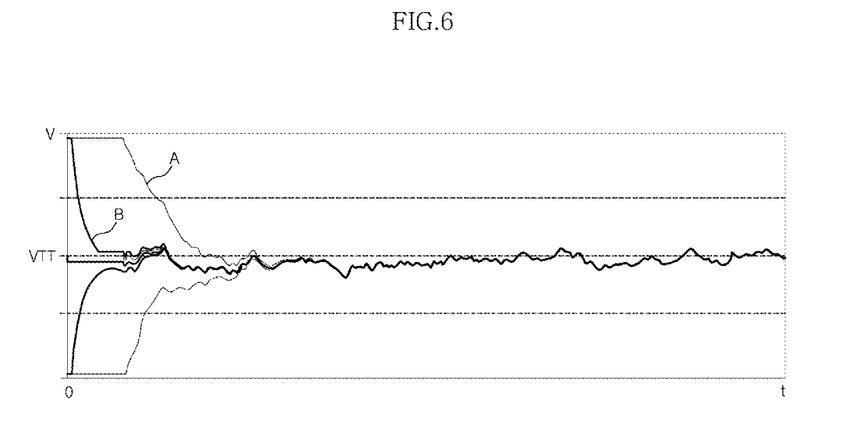
FIG. 6 is a representation of an example of a timing diagram to assist in the explanation of an operation of a system in accordance with an embodiment.

FIG. 6 is a representation of an example of a timing diagram to assist in the explanation of an operation of the system 3 (i.e., see FIG. 3) in accordance with an embodiment. Referring to FIG. 6, the horizontal axis represents time (t) and the vertical axis represents voltage (v). Line A illustrates the voltage level variations of the termination node VTT when the termination voltage generation unit 350 is not coupled with the termination node VTT. When the termination voltage generation unit 350 is not coupled with the termination node VTT, the termination voltage may be set by balanced codes. The balanced codes may mean that the sum of the logic levels of the plurality of signals transmitted from the transmission interface circuit 301 is 0. For example, in order to set the termination voltage, the transmission device may encode the plurality of signals to be transmitted through the signal transmission line 303, in such a manner that the sum of the logic levels of the plurality of signals is 0.

Referring to FIG. 6, line B illustrates the voltage level variations of the termination node VTT when the termination voltage generation unit 350 is coupled with the termination node VTT. The termination voltage generation unit 350 may pull-up drive or pull-down drive the termination node VTT when the voltage level of the termination node VTT deviates from the predetermined range. Therefore, a time for the termination node VTT to be stabilized to the level of the termination voltage may be significantly shortened. The termination voltage generation unit 350 may pull-up drive or pull-down drive the termination node VTT when the voltage level of the termination node VTT deviates from the predetermined range, and may float the termination node VTT when the voltage level of the termination node VTT is within the predetermined range. If the termination node VTT is floated, no power consumption may be induced in the termination voltage generation unit 350. Therefore, current consumption for setting the termination node VTT to the level of the termination voltage may be minimized.

While various embodiments have been described above, it will be understood to those skilled in the art that the embodiments described are examples only. Accordingly, the termination circuit, and the interface circuit and system including the same described herein should not be limited based on the described embodiments.

What is claimed is:

1. An interface circuit comprising:
   a termination resistor coupled between a reception pad and a termination node; and
   a termination voltage generation circuit configured to detect a voltage level of the termination node, and drive the termination node to a level of a termination voltage when the voltage level of the termination node deviates from a predetermined range,
   wherein the termination voltage generation circuit comprises a first comparator configured to compare the voltage level of the termination node and an up reference voltage, and generate a first comparison signal, a pull-up driver configured to pull-up drive the termination node in response to the first comparison signal, a second comparator configured to compare the voltage level of the termination node and a down reference voltage, and generate a second comparison signal, and a pull-down driver configured to pull-down drive the termination node in response to the second comparison signal, wherein the pull-up driver comprises a first resistor element coupled with a power supply voltage, and a first switching element coupled between the first resistor element and the termination node, and configured to be turned on in response to the first comparison signal, wherein the pull-down driver comprises a second resistor element coupled with a ground voltage, and a second switching element coupled between the second resistor element and the termination node, and configured to be turned on in response to the second comparison signal, wherein an impedance value of the first resistor element is substantially the same as an impedance value of the second resistor element, and the impedance values of the first and second resistor elements are less than the impedance value of the termination resistor.

2. The interface circuit according to claim 1, further comprising:
a receiver coupled with the reception pad, and configured to amplify a signal received through the reception pad.

3. The interface circuit according to claim 1, wherein the termination voltage generation circuit floats the termination node when the voltage level of the termination node is within the predetermined range.

4. The interface circuit according to claim 1, wherein the termination voltage is a middle level between the power supply voltage and the ground voltage.

5. The interface circuit according to claim 1, further comprising:
a capacitor coupled between the ground voltage and the termination node.

6. The interface circuit according to claim 5, wherein the capacitor is configured to stabilize voltage level of the termination node by preventing the voltage level of the termination node from fluctuating in response to a voltage variation, a temperature variation, or from noise.

7. The interface circuit according to claim 1, further comprising:
a transmission driver coupled to the reception pad,
wherein the transmission driver includes a pull-up transmission driver coupled between a first power supply voltage and the reception pad, and a pull-down transmission driver coupled between a ground voltage and the reception pad, and
wherein an impedance value of the termination resistor corresponds to either a turn-on impedance value of the pull-up transmission driver or the pull-down transmission driver.

8. An interface circuit comprising:
a termination resistor coupled between a reception pad and a termination node; and
a termination voltage generation circuit configured to detect a voltage level of the termination node, and drive the termination node to a level of a termination voltage when the voltage level of the termination node deviates from a predetermined range,
wherein the termination voltage generation circuit comprises a first comparator configured to compare the voltage level of the termination node and an up reference voltage, and generate a comparison signal, a second comparator configured to compare the voltage level of the termination node and a down reference voltage, and generate the comparison signal, a pull-up driver configured to pull-up drive the termination node in response to the comparison signal, and a pull-down driver configured to pull-down drive the termination node in response to the comparison signal.

9. The interface circuit according to claim 8, wherein the comparison signal is enabled when a voltage level of the termination node is greater than the up reference voltage.

10. The interface circuit according to claim 9, wherein the comparison signal is enabled when a voltage level of the termination node is less than the down reference voltage.

11. A system comprising:
a transmission device configured to drive a signal transmission line and transmit a signal; and
a reception device coupled with the signal transmission line, and configured to receive the signal,
the reception device comprising:
a termination resistor coupled between the signal transmission line and a termination node; and
a termination voltage generation circuit configured to detect a voltage level of the termination node, and drive the termination node to a level of a termination voltage when the voltage level of the termination node deviates from a predetermined range,
wherein the termination voltage generation circuit comprises a first comparator configured to compare the voltage level of the termination node and an up reference voltage, and generate a comparison signal, a second comparator configured to compare the voltage level of the termination node and a down reference voltage, and generate the comparison signal, a pull-up driver configured to pull-up drive the termination node in response to the comparison signal, and a pull-down driver configured to pull-down drive the termination node in response to the comparison signal.

12. The system according to claim 11, further comprising:
a receiver coupled between the signal transmission line and the termination resistor, and configured to receive a signal transmitted through the signal transmission line.

13. The system according to claim 11, wherein the termination voltage generation circuit floats the termination node when the voltage level of the termination node is within the predetermined range.

14. The system according to claim 11, wherein the termination voltage is a middle level between a power supply voltage and a ground voltage.

15. The interface circuit according to claim 11, further comprising:
a capacitor coupled between a ground voltage and the termination node.

16. The interface circuit according to claim 15, wherein the capacitor is configured to stabilize voltage level of the termination node by preventing the voltage level of the termination node from fluctuating in response to a voltage variation, a temperature variation, or from noise.

17. A termination circuit comprising:
a termination resistor; and
a termination voltage generation circuit coupled to the termination resistor through a termination node,
wherein the termination voltage generation circuit is configured to detect a voltage level of the termination node, and drive the termination node to a level of a termination voltage when the voltage level of the termination node deviates from a predetermined range,
wherein the termination voltage generation circuit comprises a first comparator configured to compare the voltage level of the termination node and an up reference voltage, and generate a comparison signal, a second comparator configured to compare the voltage level of the termination node and a down reference voltage, and generate the comparison signal, a pull-up driver configured to pull-up drive the termination node in response to the comparison signal, and a pull-down driver configured to pull-down drive the termination node in response to the comparison signal.

* * * * *